US010597580B2

(12) United States Patent
Min et al.

(10) Patent No.: US 10,597,580 B2
(45) Date of Patent: Mar. 24, 2020

(54) QUANTUM DOTS, PRODUCTION METHODS THEREOF, AND ELECTRONIC DEVICES INCLUDING THE SAME

(71) Applicant: SAMSUNG ELECTRONICS CO., LTD., Suwon-si, Gyeonggi-do (KR)

(72) Inventors: Jihyun Min, Seoul (KR); Eun Joo Jang, Suwon-si (KR); Yongwook Kim, Suwon-si (KR); Garam Park, Seoul (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 108 days.

(21) Appl. No.: 15/335,700

(22) Filed: Oct. 27, 2016

(65) Prior Publication Data

US 2017/0121598 A1  May 4, 2017

(30) Foreign Application Priority Data

Oct. 28, 2015 (KR) ........................ 10-2015-0150441

(51) Int. Cl.
| | |
|---|---|
| *C08K 3/16* | (2006.01) |
| *B82Y 20/00* | (2011.01) |
| *B82Y 40/00* | (2011.01) |
| *C09K 11/02* | (2006.01) |
| *C09K 11/61* | (2006.01) |
| *C09K 11/66* | (2006.01) |
| *C09K 11/88* | (2006.01) |
| *H01L 27/32* | (2006.01) |

(52) U.S. Cl.
CPC .............. *C09K 11/025* (2013.01); *C08K 3/16* (2013.01); *C09K 11/02* (2013.01); *C09K 11/616* (2013.01); *C09K 11/665* (2013.01); *C09K 11/88* (2013.01); *C09K 11/881* (2013.01); *C09K 11/883* (2013.01); *B82Y 20/00* (2013.01); *B82Y 40/00* (2013.01); *C08K 2201/001* (2013.01); *H01L 27/322* (2013.01); *H01L 2251/5369* (2013.01); *Y10S 977/774* (2013.01); *Y10S 977/896* (2013.01); *Y10S 977/95* (2013.01)

(58) Field of Classification Search
CPC ... C09K 11/025; C09K 11/0833; B82Y 26/00; Y10S 977/774
See application file for complete search history.

(56) References Cited

U.S. PATENT DOCUMENTS

| | | | |
|---|---|---|---|
| 6,322,901 | B1 | 11/2001 | Bawendi et al. |
| 6,861,155 | B2 | 3/2005 | Bawendi et al. |
| 7,105,051 | B2 | 9/2006 | Peng et al. |
| 7,427,523 | B2 | 9/2008 | Boardman et al. |
| 7,963,119 | B2 | 6/2011 | Campbell et al. |
| 8,035,772 | B2 | 10/2011 | Kim et al. |
| 8,252,205 | B2 | 8/2012 | Jun et al. |
| 8,436,964 | B2 | 5/2013 | Kim et al. |
| 8,545,736 | B2 | 10/2013 | Jun et al. |
| 8,784,685 | B2 | 7/2014 | Lifshitz et al. |
| 8,963,119 | B2 | 2/2015 | Jang et al. |
| 9,082,982 | B2 | 7/2015 | Jun et al. |
| 10,074,770 | B2 | 9/2018 | Park et al. |
| 2004/0126072 | A1 | 7/2004 | Hoon Lee et al. |
| 2008/0014463 | A1 | 1/2008 | Varadarajan et al. |
| 2008/0138514 | A1 | 6/2008 | Jang et al. |
| 2010/0006775 | A1 | 1/2010 | Gibson |
| 2010/0110728 | A1 | 5/2010 | Dubrow et al. |
| 2010/0283072 | A1 | 11/2010 | Kazlas et al. |
| 2012/0113671 | A1 | 5/2012 | Sadasivan et al. |
| 2012/0113672 | A1 | 5/2012 | Dubrow et al. |
| 2012/0305918 | A1 | 12/2012 | Shum |
| 2013/0129632 | A1 | 5/2013 | Leong et al. |
| 2014/0027711 | A1 | 1/2014 | Breen et al. |
| 2014/0071381 | A1 | 3/2014 | Jang et al. |
| 2014/0326921 | A1 | 11/2014 | Lu et al. |
| 2015/0083969 | A1 | 3/2015 | Kim et al. |
| 2015/0194577 | A1 | 7/2015 | Glarvery et al. |
| 2015/0203747 | A1 | 7/2015 | Hayley et al. |
| 2015/0218442 | A1 | 8/2015 | Jun et al. |

FOREIGN PATENT DOCUMENTS

| | | | |
|---|---|---|---|
| EP | 2905321 | A1 | 8/2015 |
| KR | 10-0871961 | B1 | 11/2008 |
| KR | 10-1165100 | B1 | 7/2012 |
| KR | 1020130044071 | A | 5/2013 |
| KR | 1020140032811 | A | 3/2014 |
| KR | 10-1460155 | B1 | 11/2014 |
| KR | 1020150032655 | A | 3/2015 |
| KR | 1015255240000 | B1 | 5/2015 |
| KR | 1015255250000 | B1 | 5/2015 |
| WO | 2013171517 | A1 | 11/2013 |
| WO | 2015127494 | A1 | 9/2015 |

OTHER PUBLICATIONS

Protesescu et al, "Nanocrystals of Cium Lead Halide Perovskitess (CsPb, X=Ci, Br and I): NovelOptoelectronic Materials Showing Bright Emission with Wide Color Range", Nanoletters, vol. 15, issue 6, Jun. 10, 2015, pp. 2692-2696.*
Declaration by Maksym Kovalenko and Franziska Krieg, submitted in the Grounds for Opposition, dated May 15, 2019, of corresponding application EP 3168278.*
European Search Report for European Patent Application No. 16196124.8 dated Apr. 18, 2017.
Zhang et al., "Solution-Phase Synthesis of Cesium Lead Halide Perovskite Nanowires", JACS, 137. 2015, pp. 9230-9233.

(Continued)

*Primary Examiner* — C Melissa Koslow
(74) *Attorney, Agent, or Firm* — Cantor Colburn LLP

(57) ABSTRACT

A quantum dot having a perovskite crystal structure and including a compound represented by Chemical Formula 1:

$ABX_{3+\alpha}$  Chemical Formula 1 wherein, A is a Group IA metal selected from Rb, Cs, Fr, and a combination thereof, B is a Group IVA metal selected from Si, Ge, Sn, Pb, and a combination thereof, X is a halogen selected from F, Cl, Br, and I, $BF_4$, or a combination thereof, and $\alpha$ is greater than 0 and less than or equal to about 3; and wherein the quantum dot has a size of about 1 nanometer to about 50 nanometers.

29 Claims, 7 Drawing Sheets

(56) References Cited

OTHER PUBLICATIONS

Protesescu et al., "Nanocrystals of Cesium Lead halide Perovskites (CsPbX3, X=Cl, Br, and I): Novel Optoelectronic Materials Showing Bright Emission with Wide Color Gamut", Nano Letters, 2015, pp. 1-5.
Zhang et al., "Brightly Luminescent and Color-Tunable Coloidal CH3NH3PbX3 (X=Br, I, Cl) Quantum Dots: Potential Alternatives for Display Technology", ACSNano, vol. 9, No. 4, 2015, pp. 4533-4542.
European Search Report for European Patent Application No. 16205175.9 dated Mar. 28, 2017.
Alexander H. IP et al., Hybrid passivated colloidal quantum dot solids, 2012, pp. 577-582, vol. 7, Nature nanotechnology.
Yiming Zhao et al., High-Temperature Luminescence Quenching of Colloidal Quantum Dots, Article, 2012, pp. 9058-9067, vol. 6, No. 10, ACSNANO.
M. Bodnarchuk, et al., "Rationalizing and Controlling the Surface Structure and Electronic Passivation of Cesium Lead Halide Nanocrystals", ACS Energy Lett., 4, 2019, 63-74.
J. Pan, et al., "Air-Stable Surface-Passivated Perovskite Quantum Dots for Ultra-Robust, Single- and Two-Photon- Induced Amplified Spontaneous Emission", J. Phys. Chem. Lett. 2015, 6, 5027-5033.
Sigma Aldrich; Cesium carbonate ReagentPlus®, 99%, www.sigmaaldrich.com/catalog/product/aldrich/44109?lang=de&region=CH, accessed Apr. 17, 2019.
Grounds of Opposition dated May 15, 2019, of the corresponding application, EP Patent Application No, 16196124.8:.
Yakunin, et al., "Low-threshold amplified spontaneous emission and lasing from colloidal nanocrystals of caesium lead halide perovskites", Nature Communications, 6:8056, 2015, 1-9.
F. Zuo et al.,"Binary-metal perovskites toward high-performance planar-heterojunction hybrid solar cells", Adv. Mater., 26, 2014, 6454-6460.
M. Kovalenko 2019, Declaration of Kovalenko Lab.
European Search Report for European Patent Application No. 18179312.6 dated Jun. 27, 2019.
Protesescu et al., "Nanocrystals of Cesium Lead Halide Perovskites (CsPbX3, X=Ci, Br, and I): Novel Optoelectronic Materials Showing Bright Emission with Wide Color Gamut", NANO Letters, 15, 2015, pp. 3692-3696.
Observations by a third party & J. Am. Chem. Soc. 2015, 137, 10276-10281 dated Jun. 27, 2019 for European Patent Application No. 18179312.6.
Loredana Protesescu, et al., "Nanocrystal of Cesium Lead Halide Perovskites (CsPbX3,X=Cl, Br, and I): Novel Optoelectronic Materials Showing Bright Emission with Wide Color Gamut", pp. 5, Publication date: Jan. 29, 2015, Publisher: ACS Publications, Journal: Nano Letters, vol. 15, pp. 3692-3696.†
Quinten A. Akkerman et al., "Tuning the Optical Properties of Cesium Lead Halide Perovskite Nanocrystals by Anion Exchange Reactions", pp. 6, Publication date: Jul. 27, 2015, Publisher: ACS Publications, Journal: Journal of the American Chemical Society, vol. 137, pp. 10276-10281.†

\* cited by examiner
† cited by third party

QUANTUM DOTS, PRODUCTION METHODS THEREOF, AND ELECTRONIC DEVICES INCLUDING THE SAME

CROSS-REFERENCE TO RELATED APPLICATION

This application claims priority to and the benefit of Korean Patent Application No. 10-2015-0150441 filed in the Korean Intellectual Property Office on Oct. 28, 2015, and all the benefits accruing therefrom under 35 U.S.C. § 119, the entire content of which is incorporated herein in its entirety by reference.

BACKGROUND

1. Field

Quantum dots, production methods thereof, and electronic devices including the same are disclosed.

2. Description of the Related Art

The physical characteristics (e.g., energy bandgaps and melting points) of nanoparticles that are known as intrinsic characteristics depend on their particle size, unlike bulk materials. For example, a semiconductor nanocrystal, also known as a quantum dot (QD), is a semiconductor material having a crystalline structure with a size of several nanometers. Quantum dots have such a small size that they have a large surface area per unit volume and exhibit quantum confinement effects, and thus have different physicochemical characteristics from the characteristics of the bulk material. Quantum dots may absorb light from an excitation source, and may emit energy corresponding to an energy bandgap of the quantum dot. In the quantum dots, the energy bandgap may be selected by controlling the sizes and/or the compositions of the nanocrystals. Also, QDs have desirable photoluminescence properties and have a high color purity. Therefore, QD technology is used for various applications, including a display element, an energy device, a bio-light emitting element, or the like.

The quantum dots may be synthesized in a vapor deposition method such as metal organic chemical vapor deposition (MOCVD) and/or molecular beam epitaxy (MBE), or in a wet chemical method by adding a precursor to an organic solvent to grow crystals. In the wet chemical method, colloidal quantum dots may be prepared, and the quantum dots are coordinated with an organic material such as a dispersing agent on its surface during the crystal growth, and thereby the organic material controls the crystal growth. Therefore, the quantum dots may have a uniform size and shape, and semiconductor nanocrystal particles having various compositions and/or structures (e.g. core/shell) may be more easily synthesized in the wet chemical method than in the vapor deposition method.

The prepared quantum dots are separated and/or rinsed, and may be processed in a form of a composite including the quantum dots dispersed in a matrix such as a polymer for a final application. In the above processes, photoluminescence characteristics of the semiconductor nanocrystals may be degraded. Therefore, there is a need to develop semiconductor nanocrystals having improved stability and photoluminescence characteristic.

SUMMARY

An embodiment provides quantum dots having improved photoluminescence properties and enhanced stability.

Another embodiment provides a method of producing the quantum dots.

Yet another embodiment provides an electronic device including the quantum dots.

In an embodiment, a quantum dot has a perovskite crystal structure, includes a compound represented by Chemical Formula 1:

  Chemical Formula 1 wherein, A is a Group IA metal selected from Rb, Cs, Fr, and a combination thereof, B is a Group IVA metal selected from Si, Ge, Sn, Pb, and a combination thereof, X is a halogen selected from F, Cl, Br, and I, $BF_4$, or a combination thereof, and α is greater than 0 and less than or equal to about 3, and wherein the quantum dot has a size of about 1 nanometer to about 50 nanometers.

A photoluminescence peak wavelength of the quantum dot may be in a range of about 300 nm to about 700 nm.

A photoluminescence peak wavelength of the quantum dot may be in a range of about 400 nm to about 680 nm.

The quantum dot may further include at least one of a first dopant and a second dopant, and the first dopant may include potassium (K) or a first metal having a crystal ionic radius of less than about 133 picometers (pm) and being different from the Group IA metal and the Group IVA metal, and the second dopant may include a non-metal element that forms a bond with the Group IVA metal.

The first metal may have a crystal ionic radius that is smaller than a crystal ionic radius of the Group IVA metal of the B in Chemical Formula 1.

The first metal may include Zn, Cd, Hg, Ga, In, Tl, Cu, Al, Li, Na, Be, Mg, Ca, Sr, Ag, Pt, Pd, Ni, Co, Fe, Cr, Zr, Mn, Ti, Ce, Gd, or a combination thereof.

In an embodiment, the non-metal element includes S, Se, Te, or a combination thereof.

In an embodiment, the quantum dot includes the first dopant, and an amount of the first dopant may be greater than or equal to about 0.001 parts per million (ppm) when measured by an inductively coupled plasma-atomic emission spectroscopy (ICP-AES) analysis.

In another embodiment, the quantum dot includes the second dopant, and an amount of the second dopant may be greater than or equal to about 0.001 ppm when measured by an inductively coupled plasma-atomic emission spectroscopy (ICP-AES) analysis.

In an embodiment, the quantum dot includes the first dopant and the second dopant and each of an amount of the first dopant and an amount of the second dopant may be greater than or equal to about 0.001 ppm when measured by an inductively coupled plasma-atomic emission spectroscopy (ICP-AES) analysis, respectively.

The compound may include $CsPbCl_{3+\alpha}$, $CsPbBr_{3+\alpha}$, $CsPbI_{3+\alpha}$, $CsPb(Cl,I)_{3+\alpha}$, $CsPb(Br,I)_{3+\alpha}$, $CsPb(Br,Cl)_{3+\alpha}$, or a combination thereof.

In the quantum dot, an atomic ratio of a halogen with respect to the Group IA metal when measured by a transmission electron microscope-energy dispersive X-ray spectroscopy (TEM-EDX) analysis may be greater than about 3.0.

In the quantum dot, an atomic ratio of a halogen with respect to the Group IA metal when measured by a transmission electron microscope-energy dispersive X-ray spectroscopy (TEM-EDX) analysis may be greater than or equal to about 3.1.

The quantum dot may have an organic ligand compound selected from RCOOH, $RNH_2$, $R_2NH$, $R_3N$, RSH, $R_3PO$, $R_3P$, ROH, RCOOR', $RPO(OH)_2$, $R_2POOH$, RCOOCOR'

(wherein, R and R' are independently a substituted or unsubstituted C1 to C24 aliphatic hydrocarbon group or a substituted or unsubstituted C6 to C24 aromatic hydrocarbon group), and a combination thereof on a surface of the quantum dot.

The quantum dot may have a full width at half maximum (FWHM) of a photoluminescence peak wavelength of less than or equal to about 30 nm.

The quantum dot may have quantum efficiency of greater than or equal to about 60%.

The quantum dot may not exhibit a decrease in quantum efficiency until after about 48 hours when it is dispersed in toluene and the resulting solution is allowed to stand in air.

In another embodiment, a method of producing a quantum dot is provided, the method including:

providing a reaction solution including a first precursor including a Group IA metal selected from Rb, Cs, and Fr, $NR_4^+$, $[CH(NH_2)_2]^+$, or a combination thereof and optionally $BF_4$, wherein, each R is independently a hydrogen atom or a substituted or unsubstituted C1 to C10 straight or branched alkyl group; and a second precursor including a halogen, and a Group IVA metal selected from Ge, Si, Sn, Pb, and a combination thereof; and, optionally at least one of a first additive and a second additive, wherein the first additive includes a halogen and a first metal having a crystal ionic radius of less than or equal to 133 picometers and being different from the Group IA metal and the Group IVA metal, and the second additive includes a non-metal element that forms a bond with the Group IVA metal; and reacting the first precursor and the second precursor in the reaction solution to synthesize a quantum dot that has a perovskite crystal structure, includes a compound represented by Chemical Formula 1, and has a size of about 1 nanometer to about 50 nanometers:

$$ABX_{3+\alpha} \qquad \text{Chemical Formula 1}$$

wherein A is the Group IA metal, $NR_4^+$, $[CH(NH_2)_2]+$, or a combination thereof, B is the Group IVA metal, X is $BF_4$, the halogen, or a combination thereof, and $\alpha$ is greater than 0 and less than or equal to about 3.

The first precursor may include $NR_4^+$ (wherein each R independently is a hydrogen atom or a C1 to C10 straight or branched alkyl group) and $BF_4$.

The second precursor may include a Pb halide, a Ge halide, a Si halide, a Sn halide, or a combination thereof.

In an embodiment, the first metal is present and includes Zn, Cd, Hg, Ga, In, Tl, Cu, Al, Li, Na, Be, Mg, Ca, Sr, Ag, Pt, Pd, Ni, Co, Fe, Cr, Zr, Mn, Ti, Ce, Gd, or a combination thereof.

The non-metal element may include S, Se, Te, or a combination thereof.

The first precursor may be a metal powder, a metal carbonate, an alkylated metal compound, a metal alkoxide, a metal carboxylate, a metal nitrate, a metal perchlorate, a metal sulfate, a metal acetylacetonate, a metal halide, a metal cyanide, a metal hydroxide, a metal oxide, a metal peroxide, or a combination thereof.

The reaction solution may include the first additive, and the first additive includes a halide of the first metal.

The first additive may include  $ZnX_2$, $CdX_2$, $HgX_2$, $GaX_3$, $InX_3$, $TlX_3$, $CuX_2$, $AlX_3$, $LiX$, $NaX$, $BeX_2$, $MgX_2$, $CaX_2$, $SrX_2$, $AgX$, $PtX_2$, $PtX_4$, $PdX_2$, $NiX_2$, $CoX_2$, $FeX_2$, $CrX_2$, $CrX_3$, $ZrX_3$, $ZrX_4$, $MnX_2$, $TiX_2$, $CeX_2$, $GdX_2$, or a combination thereof (wherein X is F, Cl, Br, or I).

The reaction solution may include the second additive and the second additive may include sulfur-trioctylphosphine (S-TOP), sulfur-tributylphosphine (S-TBP), sulfur-triphenylphosphine (S-TPP), sulfur-trioctylamine (S-TOA), sulfur-octadecene (S-ODE), sulfur-diphenylphosphine (S-DPP), sulfur-oleylamine (S-oleylamine), sulfur-dodecylamine (S-dodecylamine), dodecanethiol (DDT), octanethiol, selenium-trioctylphosphine (Se-TOP), selenium-tributylphosphine (Se-TBP), selenium-triphenylphosphine (Se-TPP), selenium octadecene (Se-ODE), selenium diphenylphosphine (Se-DPP), selenium-dodecylamine (Se-dodecylamine), tellurium-tributylphosphine (Te-TBP), tellurium-triphenylphosphine (Te-TPP), tellurium-trioctylphosphine (Te-TOP), tellurium-octadecene (Te-ODE), tellurium-diphenylphosphine (Te-DPP), tellurium-oleylamine (Te-oleylamine), tellurium-dodecylamine (Te-dodecylamine), or a combination thereof.

The reaction solution may further include a halogen organic ligand compound.

The halogen organic ligand compound may be HF, HCl, HBr, HI, alkyl halide (e.g. $CH_3Cl$, $CH_3Br$), dichloroethylene, dibromoethylene, tetrachloroethylene, tetrabromoethylene, hexachloroethane, hexachloropropylene, chlorohexanol, bromohexanol, $C_2H_3Br$, $C_2H_3Cl$, N-bromosuccinimide, or a combination thereof.

The providing the reaction solution may use a solvent selected from a C6 to C22 amine compound, a nitrogen-containing heterocyclic compound, a C6 to C40 aliphatic hydrocarbon, a C6 to C30 aromatic hydrocarbon, a C6 to C22 phosphine oxide compound, a C12 to C22 aromatic ether, and a combination thereof.

The reaction solution may further include at least one organic ligand compound selected from RCOOH, $RNH_2$, $R_2NH$, $R_3N$, RSH, $R_3PO$, $R_3P$, ROH, RCOOR', $RPO(OH)_2$, $R_2POOH$, RCOOCOR' (wherein, each R and R' are independently a substituted or unsubstituted C1 to C24 aliphatic hydrocarbon group or a substituted or unsubstituted C6 to C24 aromatic hydrocarbon group), and a combination thereof.

The providing of the reaction solution may include:

preparing a first solution including the first precursor;

preparing a second solution including the second precursor and optionally the first additive; and combining the second solution with the first solution and optionally the second additive.

In another embodiment, a quantum dot-polymer composite includes a polymer matrix; and a quantum dot, wherein the quantum dot is dispersed in the polymer matrix.

The polymer matrix may include a thiolene polymer, a (meth)acrylate polymer, a urethane polymer, an epoxy polymer, a vinyl polymer, a silicone polymer resin, or a combination thereof.

The quantum dot-polymer composite may have blue light conversion efficiency of greater than or equal to about 15%.

Another embodiment provides an electronic device including the quantum dot-polymer composite.

Still another embodiment provides an electronic device including the quantum dot.

The electronic device may be a light emitting diode (LED), an organic light emitting diode (OLED), a sensor, an imaging sensor, or a solar cell electronic device, or a liquid crystal display (LCD) device.

The quantum dots of the embodiments may have enhanced photoluminescence properties and stability even when they undergo a separation from the synthesis solvent and/or a washing process after the separation therefrom and/or when they are prepared into a quantum dot-polymer matrix.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Figure 1:
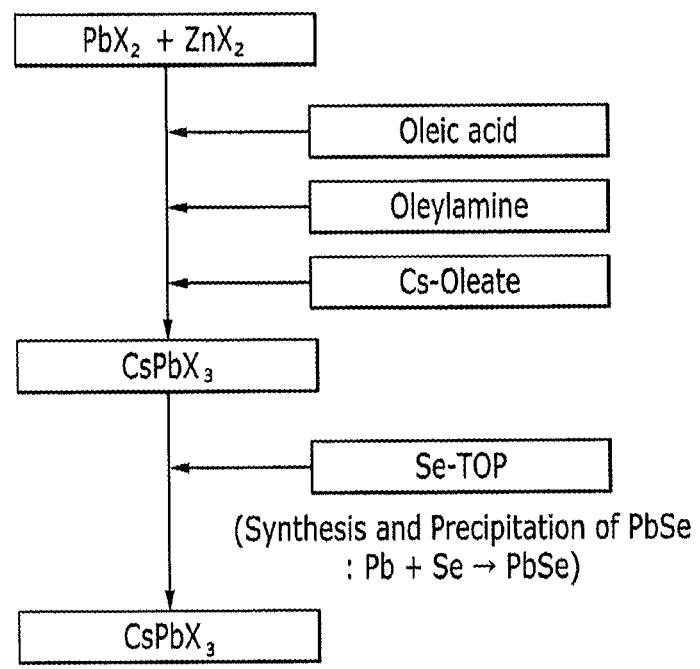
FIG. 1 is a flowchart showing a method of producing a quantum dot according to an embodiment.

Advantages and characteristics of this disclosure, and a method for achieving the same, will become evident referring to the following example embodiments together with the drawings attached hereto. The embodiments may, however, be embodied in many different forms and should not be construed as being limited to the embodiments set forth herein. If not defined otherwise, all terms (including technical and scientific terms) in the specification may be defined as commonly understood by one skilled in the art. The terms defined in a generally-used dictionary may not be interpreted ideally or exaggeratedly unless clearly defined. In addition, unless explicitly described to the contrary, the word "comprise" and variations such as "comprises" or "comprising," will be understood to imply the inclusion of stated elements but not the exclusion of any other elements.

Further, the singular includes the plural, unless mentioned otherwise.

In the drawings, the thickness of layers, films, panels, regions, etc., are exaggerated for clarity. Like reference numerals designate like elements throughout the specification.

It will be understood that when an element such as a layer, film, region, or substrate is referred to as being "on" another element, it can be directly on the other element or intervening elements may also be present. In contrast, when an element is referred to as being "directly on" another element, there are no intervening elements present.

It will be understood that, although the terms "first," "second," "third," etc. may be used herein to describe various elements, components, regions, layers, and/or sections, these elements, components, regions, layers, and/or sections should not be limited by these terms. These terms are only used to distinguish one element, component, region, layer, or section from another element, component, region, layer, or section. Thus, "a first element," "component," "region," "layer," or "section" discussed below could be termed a second element, component, region, layer, or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "At least one" is not to be construed as limiting "a" or "an." It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±10%, or 5% of the stated value.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

As used herein, when a definition is not otherwise provided, the term "substituted" refers to a group or compound wherein at least one of the hydrogen atoms thereof is substituted with a 01 to C30 alkyl group, a C2 to C30 alkynyl group, a C6 to C30 aryl group, a C7 to C30 alkylaryl group, a 01 to C30 alkoxy group, a 01 to C30 heteroalkyl group, a C3 to C30 heteroalkylaryl group, a C3 to C30 cycloalkyl group, a C3 to C15 cycloalkenyl group, a C3 to C30 cycloalkynyl group, a C2 to C30 heterocycloalkyl group, a halogen (—F, —Cl, —Br, or —I), a hydroxy group (—OH), a nitro group (—NO$_2$), a cyano group (—CN), an amino group (—NRR' wherein R and R' are independently hydrogen or a C1 to C6 alkyl group), an azido group (—N$_3$), an amidino group (—C(=NH)NH$_2$), a hydrazino group (—NHNH$_2$), a hydrazono group (=N(NH$_2$)), an aldehyde group (—C(=O)H), a carbamoyl group (—C(O)NH$_2$), a thiol group (—SH), an ester group (—C(=O)OR, wherein R is a C1 to C6 alkyl group or a C6 to C12 aryl group), a carboxyl group (—COOH) or a salt thereof (—C(=O)OM, wherein M is an organic or inorganic cation), a sulfonic acid group (—SO$_3$H) or a salt thereof (~SO$_3$M, wherein M is an organic or inorganic cation), a phosphoric acid group (—PO$_3$H$_2$) or a salt thereof (~PO$_3$MH or —PO$_3$M$_2$, wherein M is an organic or inorganic cation), and a combination thereof.

As used herein, the term "hydrocarbon group" refers to a monovalent group containing carbon and hydrogen (e.g., alkyl group, alkenyl group, alkynyl group, or aryl group)

formed by a removal of a hydrogen atom from an aliphatic or aromatic hydrocarbon such as alkane, alkene, alkyne, or arene. In the hydrocarbon group, at least one methylene (—$CH_2$—) moiety may be replaced with an oxide (—O—) moiety.

As used herein, the term "alkyl" refers to a linear or branched, saturated monovalent hydrocarbon group (e.g., methyl, hexyl, etc.).

As used herein, the term "alkenyl" refers to a linear or branched monovalent hydrocarbon group having at least one carbon-carbon double bond.

As used herein, the term "aryl" refers to a monovalent group formed by removing one hydrogen atom from at least one aromatic ring (e.g., phenyl or naphthyl).

As used herein, when a definition is not otherwise provided, the term "hetero" refers to inclusion of 1 to 3 heteroatoms that can be N, O, S, Si, P, or a combination thereof.

Further as used herein, when a definition is not otherwise provided, an alkyl group is a 01 to C20 alkyl, or a 01 to C12 alkyl, or a 01 to C6 alkyl.

As used herein, the term "Group" refers to a Group of the Periodic Table.

As used herein, "Group I" refers to Group IA and Group IB, and examples of Group I include Li, Na, K, Rb, Cs, and Fr, but are not limited thereto.

As used herein, "Group II" refers to Group IIA and Group IIB, and examples of Group II include Cd, Zn, Hg, and Mg, but are not limited thereto, except where Cd is specifically excluded.

As used herein, "Group III" refers to Group IIIA and Group IIIB, and examples of Group III include Al, In, Ga, and Tl, but are not limited thereto.

As used herein, "Group IV" refers to Group IVA and Group IVB, and examples of a Group IV include Si, Ge, and Sn, but are not limited thereto.

As used herein, the term "metal" refers to a metal such as an alkali metal, an alkaline earth metal, a transition metal, and a basic metal. The term "metal" also includes a semimetal such as Si and the like.

As used herein, "doping" refers to the inclusion of a dopant in a crystal structure. In an exemplary embodiment, inclusion of a dopant in the crystal structure does not substantially change the crystal structure. For example, a dopant atom (e.g., a first metal such as Zn, potassium, or a chalcogen) may be substituted for an atom in a crystal structure, or may be present in the interstices of a crystal lattice. In some embodiments, the dopant element may bind with an element constituting the crystal lattice to form a chemical species attached to a surface thereof.

In some embodiments, when the dopant is present in the lattice or as an alloy, an X-ray diffraction spectrum of the quantum dot including the dopant may show a crystalline peak that is shifted to a different diffraction angle relative to an X-ray diffraction spectrum of the quantum dot without the dopant. In other embodiments, the X-ray diffraction spectrum of a quantum dot including the dopant is substantially the same as the X-ray diffraction spectrum of an undoped quantum dot. When the dopant is present as a crystal outside of the lattice of the quantum dot, its inherent peak may be detected in an X-ray diffraction spectrum thereof. In an embodiment, the presence of the dopant may be confirmed, for example, by X-ray photoelectron spectroscopy, energy dispersive X ray spectroscopy, inductively coupled plasma-atomic emission spectroscopy (ICP-AES), or a combination thereof.

As used herein, the term "quantum yield" (QY) or the term "quantum efficiency (QE) is a value determined from a photoluminescence spectrum obtained by dispersing quantum dots in toluene, and may be calculated with respect to the photoluminescent peak of an organic solution of a reference dye (e.g., an ethanol solution of coumarin dye (absorption (optical density) at 458 nanometers (nm) is 0.1)). As used herein, the term "quantum yield (QY)" and the term "quantum efficiency (QE)" may have substantially the same meaning and can be used interchangeably.

In an embodiment, a quantum dot has a perovskite crystal structure and includes a compound represented by Chemical Formula 1:

$$ABX_{3+\alpha} \qquad \text{Chemical Formula 1}$$

wherein A is a Group IA metal selected from Rb, Cs, Fr, and a combination thereof, B is a Group IVA metal selected from Si, Ge, Sn, Pb, and a combination thereof, X is $BF_4$, at least one halogen selected from F, Cl, Br, and I, or a combination thereof, and α is greater than 0, for example, greater than or equal to about 0.1, or greater than or equal to about 0.2, and less than or equal to about 3 for example, less than or equal to about 2.5, less than or equal to about 2, less than or equal to about 1.5, less than or equal to about 1, less than or equal to about 0.9, less than or equal to about 0.8, less than or equal to about 0.7, less than or equal to about 0.6, less than or equal to about 0.5, less than or equal to about 0.4, or less than or equal to about 0.3. In an embodiment, a surface of the quantum dot includes a halogen.

In an embodiment, a quantum dot includes a compound represented by the above Chemical Formula 1, wherein, A is a Group IA metal (selected from Rb, Cs, Fr, and a combination thereof), $NR_4^+$, wherein each R independently is a hydrogen atom or a substituted or unsubstituted C1 to C10 straight or branched alkyl group (including but not limited to $CH_3NH_3^+$, $NH_4^+$, or $C_2H_5NH_3^+$), $[CH(NH_2)_2]^+$, or a combination thereof, B is a Group IVA metal (selected from Si, Ge, Sn, Pb, and a combination thereof), X is a halogen (selected from F, Cl, Br, I, and a combination thereof), $BF_4$, or a combination thereof, and α is 0 to about 3, and optionally includes at least one of a first dopant and a second dopant, and the first and the second dopants will be set forth below.

The perovskite crystal structure may have a cubic crystalline lattice and is confirmed by an X-ray diffraction spectrum, and the quantum dot may have a cubic shape and/or a rectangular parallelepiped shape.

The compound represented by Chemical Formula 1 may include $CsPbCl_{3+\alpha}$, $CsPbBr_{3+\alpha}$, $CsPbI_{3+\alpha}$, $CsPb(Cl,I)_{3+\alpha}$, $CsPb(Br,I)_{3+\alpha}$, $CsPb(Br,Cl)_{3+\alpha}$, or a combination thereof. As used herein, the expression (X1, X2) (wherein X1 and X2 are each independently a halogen different from each other) such as (Cl,I), (Br,I), and (Br,I), refers to a compound that includes two different halogens (i.e., Cl and I, Br and I, or Br and Cl). When the compound includes two halogens, the mole ratio therebetween is not particularly limited. For example, when the compound includes two halogens, X1 and X2, the amount of the X2 per one mole of X1 is greater than or equal to about 0.01 moles, for example, 0.1 moles, greater than or equal to about 0.2 moles, greater than or equal to about 0.3 moles, greater than or equal to about 0.4 moles, or greater than or equal to about 0.5 moles. In an embodiment, when the compound includes two halogens, X1 and X2, the amount of the X2 per one mole of X1 is less than or equal to about 100 moles, less than or equal to about 10 moles, less than or equal to about 9 moles, less than or equal to about 8 moles, less than or equal to about 7 moles, less than or equal to about 6 moles, less than or equal to about 5 moles, less than or equal to about 4 moles, less than or equal to about 4 moles, less than or equal to about 3 moles, less than or equal to about 2 moles, or less than or equal to about 1 mole. For example, when the compound includes two halogens, X1 and X2, the amount of the X2 per one mole of X1 is about 0.1 moles to about 10 moles, about 0.2 moles to about 5 moles, or about 0.3 moles to about 3 moles, but it is not limited thereto.

In the quantum dot, an atomic ratio of the halogen atoms relative to the Group IA metal atoms when measured by a transmission electron microscope-energy dispersive X-ray spectroscopy (TEM-EDX) analysis may be greater than or equal to about 3.0, for example, greater than about 3.0 or greater than or equal to about 3.1. The quantum dot may include a greater amount of halogen than a stoichiometric amount for the formation of the perovskite crystal and/or the quantum dot may have a halogen rich surface.

The quantum dot may further include at least one of a first dopant and a second dopant. The first dopant may include potassium (K) or a first metal having a crystal ionic radius of less than about 133 picometers (pm) and being different from the Group IA metal and the Group IVA metal. The second dopant may include a non-metal element that forms a bond with the Group IVA metal. For example, the first metal may have a crystal ionic radius of about 67 pm to about 120 pm. The first metal may have a crystal ionic radius that is less than the crystal ionic radius of the Group IVA metal of B. For example, when B is Pb, the crystal ionic radius of the first metal is less than 133 pm. The crystal ionic radius may correspond to the physical size of the ion in a solid, and in this regard, the publication of the revised ionic radius by Shannon may be referred to (e.g., R. D. Shannon (1976) "Revised effective ionic radii and systematic studies of interatomic distances in halides and chalcogenides". Acta Cryst A32, pp. 751-767, the content of which is incorporated herein by reference in its entirety).

The first dopant may be a substitute for the metal element (e.g., the Group IA metal such as Cs and Rb, and/or the Group IVA metal such as Pb) in the compound. In an embodiment, the first dopant may include the first metal having a crystal ionic radius that is less than crystal ionic radius of the Group IVA metal. In an embodiment, the first dopant may include a metal ion having the same valency as that of the Group IVA metal or a Group IA metal (e.g., a monovalent ion or a divalent ion). In an embodiment, the first dopant may include a metal element that forms a compound (e.g., a metal oxide) having a lattice structure that is substantially similar to that of the perovskite lattice structure. The second dopant may include an element that may form a chemical bond with the Group IVA metal (e.g., Pb) during the synthesis of a quantum dot including the aforementioned compound, and thereby may be precipitated out of solution. Without wishing to be bound by theory, this may contribute to decreasing the amount of the Group IVA metal in a reaction system during the synthesis. As a result, the resulting quantum dot may include an excess amount of the halogen, or a surface of the quantum dot may include a halogen.

In some embodiments, the first metal may be selected from Zn, Cd, Hg, Ga, In, Tl, Cu, Al, Li, Na, Be, Mg, Ca, Sr, Ag, Pt, Pd, Ni, Co, Fe, Cr, Zr, Mn, Ti, Ce, Gd, and a combination thereof. In some embodiments, the non-metal element may be selected from S, Se, Te, and a combination thereof.

The presence of the first and second dopants may be confirmed by an inductively coupled plasma-atomic emission spectroscopy (ICP-AES) analysis. For example, in the quantum dot, the amount of the first dopant may be greater than or equal to about 0.001 ppm, for example, greater than or equal to about 0.04 ppm as measured by ICP-AES. In the quantum dot, the amount of the second dopant may be greater than or equal to about 0.001 ppm, for example, about 0.04 ppm when measured by ICP-AES.

The quantum dot may be a colloidal quantum dot prepared in a wet chemical method, and thus a surface of the quantum dot may have an organic ligand compound selected from RCOOH, $RNH_2$, $R_2NH$, $R_3N$, RSH, $R_3PO$, $R_3P$, ROH, RCOOR', $RPO(OH)_2$, $R_2POOH$, RCOOCOR' (wherein, each R and R' are independently a substituted or unsubstituted C1 to C24 aliphatic hydrocarbon group such as an alkyl group, an alkenyl group, or an alkynyl group, or a substituted or unsubstituted C6 to C24 aromatic hydrocarbon group such as an aryl group), and a combination thereof.

Specific examples of the organic ligand compound may include methane thiol, ethane thiol, propane thiol, butane thiol, pentane thiol, hexane thiol, octane thiol, dodecane thiol, hexadecane thiol, octadecane thiol, benzyl thiol; methane amine, ethane amine, propane amine, butane amine, pentane amine, hexane amine, octane amine, dodecane amine, hexadecyl amine, oleyl amine, octadecyl amine, dimethyl amine, diethyl amine, dipropyl amine, dl oleyl amine; methanoic acid, ethanoic acid, propanoic acid, butanoic acid, pentanoic acid, hexanoic acid, heptanoic acid, octanoic acid, dodecanoic acid, hexadecanoic acid, octadecanoic acid, oleic acid, benzoic acid, palmitic acid, stearic acid; a phosphine such as methyl phosphine, ethyl phosphine, propyl phosphine, butyl phosphine, pentyl phosphine, tributylphosphine, or trioctylphosphine; a phosphine oxide compound such as methyl phosphine oxide, ethyl phosphine oxide, propyl phosphine oxide, butyl phosphine oxide, or trioctylphosphine oxide; diphenyl phosphine, a triphenyl phosphine compound or an oxide compound thereof; phosphonic acid, and the like, but are not limited thereto. The organic ligand compound may be used alone or as a mixture of at least two organic ligands.

In some embodiments, the quantum dot does not include an amine organic ligand having an alkyl group of at least 6 carbon atoms, such as at least 8 carbon atoms (e.g., n-octyl amine).

The quantum dot (i.e., a nanocrystal particle including a semiconductor material) may have an energy bandgap that varies based on size and composition, and may have desirable photoluminescence properties such as color purity. These compounds may be suitable as a material applicable to various fields such as a display, an energy device, a semiconductor, a bio device, and the like. A colloidal halide perovskite quantum dot may be a suitable quantum dot material due to its photoluminescence properties such as color tunability, desirable bandgap, and the like.

The present inventors have found that the halide perovskite quantum dot of, for instance, a $CsPbX_3$ nanoparticle or a $CH_3NHPbX_3$ nanoparticle, does not have desirable stability. For example, the halide perovskite quantum dot may exhibit an undesirable quantum yield when they are separated from a synthesis solvent and/or washed to remove the solvent, or after dispersion in a dispersion solvent (e.g., toluene). In addition, the dispersibility of the halide perovskite quantum dot may decrease over time. For example, when the halide perovskite quantum dot is separated from the synthesis solvent thereof, dispersed in a dispersion solvent such as toluene, and then allowed to stand in the air, it loses its photoluminescence within one week, and is precipitated.

Without wishing to be bound by any theory, when the halide perovskite quantum dot is separated from their synthesis solvent and washed, they may lose an amount of an organic ligand previously bound to a surface thereof, and due to such a loss of the ligand, the metal elements may be exposed on a surface thereof. The exposed metal elements may be susceptible to an external environment such as oxygen, moisture, or heat, and the metal elements may then be transformed into an oxide or a decomposition product. However, rather than being used directly after the synthesis, the quantum dots may be washed with a non-solvent for the removal of impurities, and then be re-dispersed in a solvent optimized for an applied field. In addition, the quantum dots may go through a surface exchange or may be prepared into a quantum dot-polymer composite. The aforementioned changes on a surface of the quantum dot (i.e., loss of the ligand and exposure of a metal atom) after the washing with the non-solvent and the stability deterioration caused thereby may hinder the subsequent application of the quantum dot.

A quantum dot according to an embodiment may include a first dopant such as Zn and a second dopant such as Se and/or additionally a halogen in an amount that exceeds the amount that is necessary for the formation of the perovskite structure. Accordingly, the quantum dots according to an embodiment may not show a substantial decrease in quantum efficiency (or a quantum yield) when they are removed from a synthesis solvent, washed, and then dispersed again in a dispersion solvent. For example, after being separated from the synthesis solvent, the quantum dots of an embodiment may have a quantum efficiency of greater than or equal to about 60%, for example, greater than or equal to about 70%, greater than or equal to about 75%, or greater than or equal to about 80% of its original quantum efficiency. In addition, the quantum dots of an embodiment may be stable with respect to an external environment such as oxygen, moisture, and the like when they are dispersed in a dispersion solvent (e.g., toluene). For example, the quantum dots of an embodiment may maintain their initial quantum efficiency for about 24 hours or longer, or about 48 hours or longer, in the air. In addition, the quantum dots of an embodiment may include a surface ligand in at least an amount necessary for maintaining their stability, even when they are separated from the synthesis solvent and washed. Therefore, the quantum dots of an embodiment may be re-dispersed in various dispersion solvents even after being kept in the air. In addition, the perovskite quantum dots according to an embodiment may include an excess amount of a halogen together with a first dopant and/or a second dopant on a surface thereof while keeping the ligand loss at a minimum level or suppressing the same. Therefore, a surface oxidation of the quantum dots and/or loss of constituting elements due to heat, moisture, light, and the like may be minimized. Without wishing to be bound by any theory, inclusion of the excess amount of halogen on a surface thereof together with the first/second dopants may bring forth a change in the elemental composition of the entire and/or the surface of the quantum dot (e.g., the entire and/or the surface compositions of the quantum dot) and this may reduce the amount of the organic ligand that is lost when the quantum dots are washed with a non-solvent. In addition, an individual or combined effect of the halogen element, the dopant, and the ligand on a surface thereof may reduce the amount of oxidation of the metal element constituting the perovskite structure, and thereby may preserve the perovskite structure. The perovskite quantum dot of the aforementioned embodiments including the compound of Chemical Formula 1 may be an inorganic material, and thus may show desirable long term stability in comparison of the perovskite quantum dot including an organic substance (e.g., an amine salt).

The perovskite quantum dot may have a size of about 1 nm to about 50 nm, for example, about 2 nm to about 15 nm, or about 3 nm to about 14 nm. The size of the quantum dot may be measured using any suitable method. For example, the size of the quantum dot may be directly measured from a transmission electron microscopic (TEM) image or may be calculated from the full width at half maximum (FWHM) of the peak of the XRD spectrum and Scherrer equation.

The quantum dot may have a perovskite crystal structure and a cubic or rectangular cuboid shape, but is not limited thereto. The quantum dot may have a FWHM of a photoluminescence peak wavelength of less than or equal to about 30 nm, for example, less than or equal to about 29 nm, less than or equal to about 28 nm, less than or equal to about 27 nm, less than or equal to about 26 nm, or less than or equal to about 25 nm. The quantum dot may have quantum efficiency (QE) or quantum yield (QY) of greater than or equal to about 60%, for example, greater than or equal to about 62%, greater than or equal to about 63%, greater than or equal to about 64%, greater than or equal to about 65%, greater than or equal to about 66%, or greater than or equal to about 67%. The perovskite quantum dot of an embodiment, for example, includes no cadmium but may show desirable photoluminescence characteristics (e.g., a high quantum efficiency, a narrow FWHM, and thus desirable color purity, and the like).

Other embodiments provide a method of preparing a perovskite quantum dot, which includes:

preparing a reaction solution including a first precursor including a Group IA metal selected from Rb, Cs, Fr, and a combination thereof, $NR_4^+$ (wherein each R independently is a hydrogen atom or a substituted or unsubstituted C1 to 010 straight or branched alkyl group), $[CH(NH_2)_2]+$, or a combination thereof, and optionally $BF_4$ (e.g., $NR_4BF_4$); a second precursor including a halogen and a Group IVA metal selected from Ge, Si, Sn, Pb, and a combination thereof; and at least one of a first additive and a second additive, wherein the first additive includes a halogen and a first metal having a crystal ionic radius of less than or equal to about 133 pm and being different from the Group IA metal and the Group IVA metal, and the second additive includes a non-metal element that may form a bond with the Group IVA metal; and carrying out a reaction between the first precursor and the second precursor in the reaction solution to synthesize a quantum dot that has a perovskite crystal structure, includes a compound represented by Chemical Formula 1, and has a size of about 1 nm to about 50 nm:

　　　　　　　Chemical Formula 1 wherein A is $NR_4^+$, $[CH(NH_2)_2]+$, the Group IA metal, or a combination thereof, B is the Group IVA metal, X is $BF_4$, the halogen, or a combination thereof, and α is greater than 0 and less than or equal to about 3.

The halogen may include F, Cl, Br, I, or a combination thereof.

The preparing of the reaction solution may include solvating the first precursor, the second precursor, the first additive, the second additive, or combination thereof in a solvent selected from a C6 to C22 amine compound, a nitrogen-containing heterocyclic compound, a C6 to C40 aliphatic hydrocarbon, a C6 to C30 aromatic hydrocarbon, a C6 to C22 phosphine oxide compound, a C12 to C22 aromatic ether, and a combination thereof.

The reaction solution may further include at least one organic ligand compound selected from RCOOH, RNH$_2$, R$_2$NH, R$_3$N, RSH, R$_3$PO, R$_3$P, ROH, RCOOR', RPO(OH)$_2$, R$_2$POOH, RCOOCOR' (wherein, each R and R' are independently a substituted or unsubstituted C1 to C24 aliphatic hydrocarbon group or a substituted or unsubstituted C6 to C24 aromatic hydrocarbon group) and a combination thereof.

Figure 2:
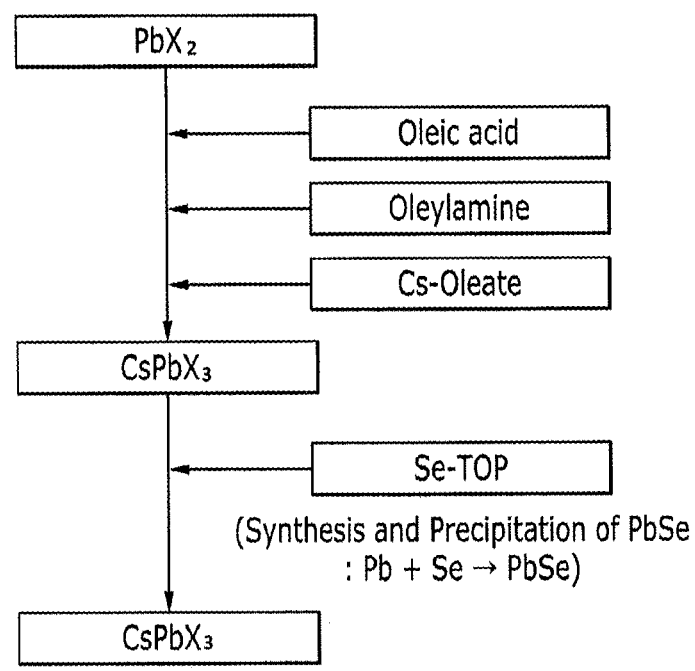
FIG. 2 is a flowchart showing a method of producing a quantum dot according to another embodiment.
Figure 3:
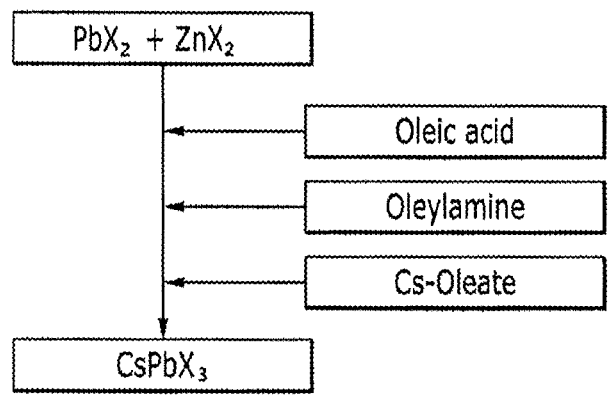
FIG. 3 is a flowchart showing a method of producing a quantum dot according to another embodiment.

Referring to FIGS. 1 to 3 illustrating non-limiting examples, the preparation of a reaction solution is illustrated in more detail.

Referring to FIG. 1, the second precursor (e.g., PbX$_2$) and the first additive (e.g., ZnX$_2$) are mixed in a solvent, and the organic ligand (e.g., oleylamine and oleic acid) is injected thereinto to prepare a solution of the second precursor and the first additive.

Aside from the preparation of the aforementioned solution, a compound including a Group IA metal (e.g., Cs$_2$CO$_3$) or a quaternary ammonium salt (e.g., a [CH(NH$_2$)$_2$]$^+$ salt or a NR$_4^+$ salt such as CH$_3$NH$_3$Br or CH$_3$NH$_3$BF$_4$) is dissolved in a solvent and optionally a compound (e.g., oleic acid) for forming the first precursor, and the solution is optionally heated to prepare a first precursor solution including the first precursor (e.g., Cs oleate, that is, Group IA metal-carboxylate or quaternary ammonium salt such as CH$_3$NH$_3$Br).

The first precursor solution is added to a solution including the second precursor and the first additive to obtain a reaction solution, and a reaction between the first and the second precursors is carried out in the reaction solution. The reaction may be carried out at a predetermined temperature (e.g., at greater than or equal to about 50° C. (e.g., a temperature of about 100° C. to about 240° C.)). If desired, the second additive (e.g., selenium-triphenylphosphine (Se-TOP)) may be added to the reaction solution before the initiation of the reaction or after the progress of the reaction, and before the completion of the reaction.

Referring to FIG. 2, the second precursor (e.g., PbX$_2$) may be mixed with (or dissolved in) a solvent, and the organic ligand (e.g., oleylamine and oleic acid) is injected thereto and the second precursor is solubilized to prepare a second precursor-containing solution.

A first precursor solution including the first precursor (e.g., Cs oleate, that is, a Group IA metal-carboxylate) may be prepared by dissolving a compound including a Group IA metal (e.g., Cs$_2$CO$_3$) in a solvent and optionally a compound for forming the first precursor (e.g., oleic acid), and optionally heating the solution.

The first precursor solution is added to the second precursor-containing solution to obtain a reaction solution, and a reaction between the first and the second precursors is carried out, for example, at a temperature of greater than or equal to about 50° C. (e.g., a temperature of about 100° C. to about 240° C.), and the second additive (e.g., Se-TOP) may be added to the reaction solution before the initiation of the reaction or after the progress of the reaction, and before the completion of the reaction. In some embodiments, the first precursor solution may be mixed with the second precursor-containing solution during a process of preparing the second precursor-containing solution or adding materials for the second precursor to the first precursor solution in any order.

Referring to FIG. 3, the second precursor (e.g., PbX$_2$) and the first additive (e.g., ZnX$_2$) are mixed with (dissolved in) a solvent, and the organic ligand (e.g., oleylamine and oleic acid) is injected thereto to dissolve the second precursor and the first additive and thereby a solution including the second precursor and the first additive is prepared. The solution including the first precursor may be prepared in accordance with the aforementioned manner and may be added to the solution including the second precursor and the first additive to provide the reaction solution. As the reaction solution is heated to a reaction temperature (e.g., a temperature of greater than or equal to about 80° C., for example, a temperature of about 100° C. to about 240° C.), a reaction between the first and the second precursors is carried out to synthesize the aforementioned quantum dot.

In the method illustrated in FIGS. 1 to 3, the first additive and the second precursor are simultaneously dissolved in a solvent, but it is not limited thereto. The first additive may be prepared as a separate solution from the second precursor and then be added to the reaction solution at any point prior to or during the synthesis of the compound represented by Chemical Formula 1.

In addition, the second additive may be added to the reaction solution at any time prior to or during the synthesis of the compound represented by Chemical Formula 1.

As described above, in the aforementioned method, the reaction solution may include the first additive, the second additive, or both, before the initiation of the reaction or during the progress of the reaction. Accordingly, the reaction solution may include a reduced concentration of the Group IVA metal (e.g. Pb) and a relatively high concentration of the halogen.

Without wishing to be bound by any theory, in the aforementioned method, the first additive may play a role of an additional supply source of the halogen and may contribute to reducing the relative amount of the Group IVA metal in the prepared quantum dot because the metal included therein (e.g., the first metal) may replace the Group IVA metal or may be added (e.g., be injected as an interstitial element or be bound physically on a surface of the quantum dot). In addition, the second additive may form a precipitate together with the Group IVA metal element (e.g., PbSe) during the synthesis of the compound represented by Chemical Formula 1, and thereby may further reduce the relative amount of the Group IVA metal element in the quantum dot. Therefore, the quantum dot prepared according to the aforementioned method may have a halogen rich surface as confirmed by a TEM-EDX analysis without additional process steps such as a ligand assisted re-precipitation (LARP) process. In addition, the quantum dot prepared according to the aforementioned method may include the first dopant originated from the first additive and the second dopant originated from the second additive.

In the aforementioned method, the first precursor includes the Group IA metal (e.g., Cs or Rb), and may be a metal powder, metal carbonate, alkylated metal compound, metal alkoxide, metal carboxylate, metal nitrate, metal perchlorate, metal sulfate, metal acetylacetonate, metal halide, metal cyanide, metal hydroxide, metal oxide, or metal peroxide. The first precursor may be used alone or as a mixture of two or more species. In an embodiment, the first precursor may include NR$_4^+$ (wherein each R independently is a hydrogen atom or a substituted or unsubstituted C1 to 010 straight or branched alkyl group) such as CH$_3$NH$_3^+$, NH$_4^+$, C$_2$H$_5$NH$_3^+$, HC(NH$_2$)$_2^+$, or a combination thereof. The first precursor may include a quaternary ammonium salt and an anion, wherein the anion may be, for instance, a halogen or BF$_4^-$ (e.g., a [CH(NH$_2$)$_2$]$^+$ salt or a NR$_4^+$ salt such as CH$_3$NH$_3$Br or CH$_3$NH$_3$BF$_4$).

The first precursor may include the one (e.g., Cs-oleate) obtained by reacting a compound (e.g., Cs$_2$CO$_3$) including a Group IA metal with a certain compound (e.g., an organic ligand such as oleic acid) in a reaction solvent. The first precursor may be heated to a temperature of greater than or equal to about 80° C., for example, greater than or equal to about 100° C., before the injection to minimize the amount of precipitation from the reaction solution.

The second precursor may include a Pb halide such as $PbCl_2$, $PbI_2$, or $PbBr_2$, a Ge halide such as $GeCl_2$, $GeCl_4$, $GeI_2$, $GeI_4$, $GeBr_2$, or $GeBr_4$, a Si halide such as $SiCl_2$, $SiCl_4$, $SiI_2$, $SiI_4$, $SiBr_2$, $SiBr_4$, a Sn halide such as $SnCl_2$, $SnI_2$, or $SnBr_2$, or a combination thereof. The second precursor may be used alone or as a mixture of at least two compounds. For the solubilization of the second precursor, the resulting mixture may heated at a predetermined temperature (e.g., greater than or equal to about 80° C., for example, greater than or equal to about 120° C.) in the presence of an organic ligand depending on a selected solvent.

The first additive may include a zinc halide such as $ZnCl_2$, $ZnBr_2$, or $ZnI_2$, a Cd halide such as $CdCl_2$, $CdBr_2$, or $CdI_2$, a Hg halide such as $HgCl_2$, $HgBr_2$, or $HgI_2$, a Ga halide such as $GaCl_3$, $GaBr_3$, or $GaI_3$, an In halide such as $InCl_3$, $InBr_3$, or $InI_3$, a Tl halide such as Tl Cl, TlBr, or TlI, a Cu halide such as $CuCl_2$, $CuBr_2$, or $CuI_2$, a Al halide such as $AlCl_3$, $AlBr_3$, or $AlI_3$, a Li halide such as LiCl, LiBr, or Lit, a Na halide such as NaCl, NaBr, or NaI, a K halide such as KCl, KBr, or KI, a Be halide such as $BeCl_2$, $BeBr_2$, or $BeI_2$, a Mg halide such as $MgCl_2$, $MgBr_2$, or $MgI_2$, a Ca halide such as $CaCl_2$, $CaBr_2$, or $CaI_2$, a Sr halide such as $SrCl_2$, $SrBr_2$, or $SrI_2$, a Ag halide such as AgCl, AgBr, or AgI, a Pt halide such as $PtCl_2$, $PtBr_2$, or $PtI_2$, a Pd halide such as $PdCl_2$, $PdBr_2$, or $PdI_2$, a Ni halide such as $NiCl_2$, $NiBr_2$, or $NiI_3$, a Co halide such as $CoCl_2$, $CoBr_2$, or $CoI_2$, a Fe halide such as $FeCl_2$, $FeBr_2$, or $FeI_2$, a Cr halide such as $CrCl_3$, $CrBr_3$, or $CrI_3$, a Zr halide such as $ZrCl_4$, $ZrBr_4$, or $ZrI_4$, a Mn halide such as $MnCl_2$, $MnBr_2$, or $MnI_2$, a Ti halide such as $TiCl_3$, $TiBr_3$, or $TiI_3$, a Ce halide such as $CeCl_3$, $CeBr_3$, or $CeI_3$, a Gd halide such as $GdCl_3$, $GdBr_3$, or $GdI_3$, or a combination thereof. The first additive may be used alone or as a mixture of two or more compounds.

The second additive may be sulfur-trioctylphosphine (S-TOP), sulfur-tributylphosphine (S-TBP), sulfur-triphenylphosphine (S-TPP), sulfur-trioctylamine (S-TOA), sulfur-octadecene (S-ODE), sulfur-diphenylphosphine (S-DPP), sulfur-oleylamine (S-oleylamine), sulfur-dodecylamine (S-dodecylamine), dodecanethiol (DDT), octanethiol, selenium-trioctylphosphine (Se-TOP), selenium-tributylphosphine (Se-TBP), selenium-triphenylphosphine (Se-TPP), selenium-octadecene (Se-ODE), selenium-diphenylphosphine (Se-DPP), selenium-dodecylamine (Se-Dodecylamine), tellurium-tributylphosphine (Te-TBP), tellurium-triphenylphosphine (Te-TPP), tellurium-trioctylphosphine (Te-TOP), tellurium-octadecene (Te-ODE), tellurium-diphenylphosphine (Te-DPP), tellurium-oleylamine (Te-Oleylamine), tellurium-dodecylamine (Te-dodecylamine), or a combination thereof.

The solvent may include a C6 to C22 primary alkylamine such as hexadecylamine, a C6 to C22 secondary alkylamine such as dioctylamine, a C6 to C40 tertiary alkylamine such as trioctylamine, a nitrogen-containing heterocyclic compound such as pyridine, a C6 to C40 olefin such as octadecene, a C6 to C40 aliphatic hydrocarbon such as hexadecane, octadecane, or squalane, an aromatic hydrocarbon substituted with a C6 to C30 alkyl group such as phenyldodecane, phenyltetradecane, or phenyl hexadecane, a phosphine substituted with a C6 to C22 alkyl group such as trioctylphosphine, a phosphine oxide substituted with a C6 to C22 alkyl group such as trioctylphosphine oxide, a C12 to C22 aromatic ether such as phenyl ether, or benzyl ether, or a combination thereof. The solvent may be selected considering the precursors and organic ligands.

The reaction may be performed under any suitable conditions such as a temperature or a time without a particular limit. For example, the reaction may be performed at greater than or equal to about 50° C. (e.g., a temperature of about 100° C. to about 240° C.) for greater than or equal to about 1 second (e.g., about 10 seconds to about 20 minutes), but it is not limited thereto. The reaction may be performed under an inert gas atmosphere, in the air, or under a vacuum, but it is not limited thereto.

After the completion of the reaction, a non-solvent is added to the resulting reaction mixture and thereby a quantum dot having the organic ligand coordinated on the surface may be separated therefrom. The non-solvent may include a polar solvent that is miscible with the solvent used in the reaction and nanocrystals are not dispersible therein. The non-solvent may be selected in light of the solvent used in the reaction and for example, it may include acetone, ethanol, butanol, isopropanol, water, tetrahydrofuran (THF), dimethylsulfoxide (DMSO), diethylether, formaldehyde, acetaldehyde, ethylene glycol, a solvent having a similar solubility parameter to the foregoing solvents, or a combination thereof. The separation may be carried out by centrifugation, precipitation, chromatography, or distillation. The separated nanocrystal may be added to a washing solvent for washing if desired. Types of the washing solvent are not particularly limited and may include a solvent having a similar solubility parameter to the ligand. For example, the washing solvent may include hexanes, heptane, octane, chloroform, toluene, benzene, and the like.

A quantum dot manufactured according to the foregoing method may have a perovskite structure and may include a halogen in an excess amount, (e.g., on a surface thereof), as determined by the TEM-EDX analysis. In addition, the quantum dot may further include the first dopant and/or the second dopant, the presence of which are confirmed by the ICP-AES analysis. The quantum dot of an embodiment has this structure and may show improved stability in a dispersion solvent or a polymer matrix after the process of solvent washing and separation as described above.

Figure 5:
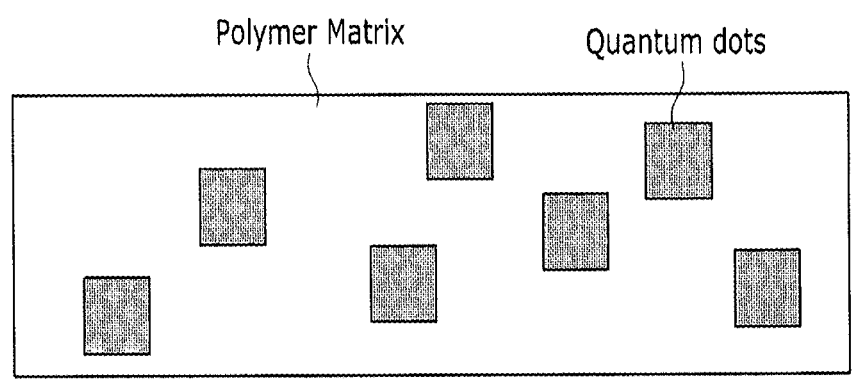
FIG. 5 is a cross-sectional view showing a quantum dot-polymer composite according to an embodiment.

In another embodiment, a quantum dot-polymer composite includes a polymer matrix; and the quantum dot dispersed in the polymer matrix (see FIG. 5). The polymer matrix may be a thiol-ene polymer, a (meth)acrylate-based polymer, a urethane-based resin, an epoxy-based polymer, a vinyl-based polymer, a silicone resin, or a combination thereof. The thiolene polymer is disclosed in US-2012-0001217-A1 which is incorporated herein by reference in its entirety. The (meth)acrylate-based polymer, the urethane-based resin, the epoxy-based polymer, the vinyl-based polymer, and the silicone resin may be synthesized by any suitable methods, or monomers or polymers thereof may be commercially available.

An amount of the quantum dot in the polymer matrix may be appropriately selected and is not particularly limited. For example, the amount of the quantum dot in the polymer matrix may be greater than or equal to about 0.1 weight percent (wt %) and less than or equal to about 30 wt % based on the total weight of the composite, but is not limited thereto.

A method of manufacturing the quantum dot polymer composite may include mixing a dispersion including the quantum dot with a solution including a polymer and, then, removing a solvent therefrom, but is not limited thereto. In an embodiment, the quantum dot polymer composite may be obtained by dispersing the quantum dot in a monomer mixture for forming the polymer and polymerizing the obtained final mixture. This quantum dot-polymer composite may be a quantum dot sheet (QD sheet).

The quantum dot may show stability reinforced in the monomer mixture or the polymer matrix and thus have a desirable luminous efficiency.

Some embodiments are directed to an electronic device including the aforementioned quantum dot polymer composite. Some embodiments are directed to an electronic device including the quantum dot of the aforementioned embodiments. In an embodiment, the electronic device may include a display device wherein the quantum dot polymer composite is used as a photo-conversion layer. In the electronic device, the quantum dot polymer composite may be positioned in a distance (or spaced apart) from a LED light source or may be in the form of a LED on-chip (a LED Package). The quantum dot polymer composite may be included in a wave guide. The quantum dot polymer composite may be included in the form of a rail, a film, or a patterned layer.

In some embodiments, the quantum dot may be used in a luminescent layer of an electro-luminescent (EL) device. In the EL device, the quantum dot may be used together with a light emitting organic or a light emitting polymer. The quantum dot may be used alone in the luminescent layer of the EL device. The structure of the aforementioned electronic devices are described, for example, in U.S. Pat. No. 6,501,091 (a LED on-chip, a LED package, or the like), U.S. Pat. No. 8,472,758 (waveguide), U.S. Pat. No. 8,718,437, U.S. Patent Publication No. 20150362654A1, U.S. Patent Publication No. 20130148376A1, U.S. Patent Publication No. 20160077269A1, U.S. Pat. Nos. 9,322,979, 9,063,363, 8,835,941, 9,054,329, and 7,700,200, the entire contents of which are incorporated herein by reference in their entirety.

Figure 6:
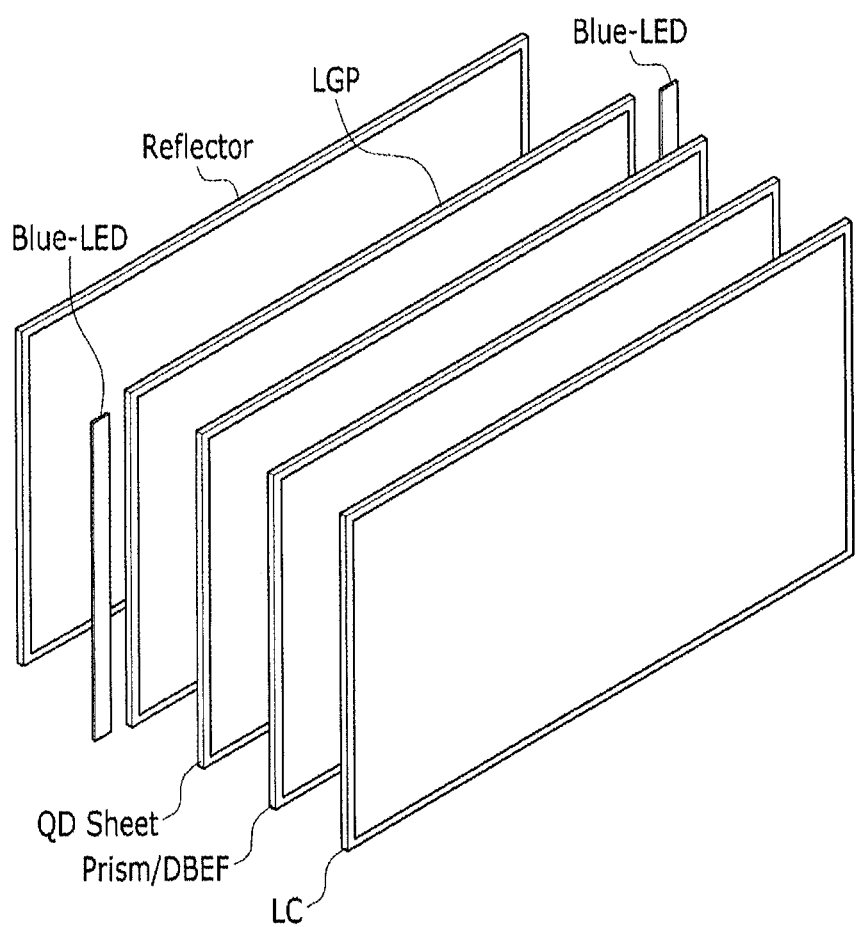
FIG. 6 is a schematic illustration of a display structure including a quantum dot-polymer composite (QD sheet) according to an embodiment.

The electronic device may be a light emitting diode (LED), an organic light emitting diode (OLED), a sensor, a solar cell, or an imaging sensor, but is not limited thereto. FIG. 6 shows a stacking structure of a liquid crystal display (LCD) including the quantum dot sheet among these devices. Referring to FIG. 6, the structure of the LCD may include a reflector, a light guide panel (LGP), a blue LED light source (Blue-LED), a quantum dot-polymer composite sheet (QD sheet), optical films (e.g., a prism, and a double brightness enhance film (DBEF) that are stacked), and a liquid crystal panel that is disposed thereon.

Hereinafter, the embodiments are illustrated in more detail with reference to examples. However, they are example embodiments of the present invention, and the present invention is not limited thereto.

EXAMPLES

Analysis Method

[1] Photoluminescence Analysis Such as Quantum Efficiency and the Like

A Hitachi F-7000 spectrometer is used to perform a photoluminescence spectrum analysis when light at 458 nm is radiated. Based on the obtained photoluminescence spectrum, a maximum photoluminescence peak wavelength, quantum efficiency, and a full width at half maximum (FWHM) are evaluated. The quantum efficiency is calculated with respect to the photoluminescent peak of an ethanol solution of coumarin dye (absorption (optical density) at 458 nanometers (nm) is 0.1).

[2] TEM Analysis

A transmission electron microscope image is obtained by using a TEM-TITAN-80-300 (FEI) equipment at an acceleration voltage of 300 KV. Accordingly, the average diameter of a quantum dot is measured.

[3] X-Ray Diffraction Analysis

An X-ray diffraction spectrum by using a Philips XPert PRO equipment is obtained.

[4] EDX Analysis

An EDS measuring device mounted on the TEM-TITAN-80-300 (FEI) is used to perform an energy-dispersing X-ray spectrum analysis.

[5] XPS Analysis

Quantum 2000 made by Physical Electronics, Inc. is used to perform an XPS element analysis under a condition of an acceleration voltage: 0.5-15 keV, 300 W, and a minimum analysis area: 200×200 µm$^2$.

[6] ICP Analysis

ICPS-8100 (Shimadzu Corp.) is used to perform an inductively-coupled plasma-element releasing spectrum analysis.

Example 1: Synthesis of CsPbBr$_3$+, Doped with Zn and Se

[1] Preparation of Cs Precursor Solution

Cs$_2$CO$_3$ (0.8 grams (g), Sigma-Aldrich, 99%) is put into a 100 milliliter (mL) 3-neck flask along with octadecene (30 mL, Sigma-Aldrich, 90%, ODE) and oleic acid (2.5 mL, Sigma-Aldrich, 90%, OA), and the mixture is dried at 120° C. for one hour, and subsequently heated at 150° C. under N$_2$ to react the Cs$_2$CO$_3$ with the oleic acid and thereby obtain a first precursor of Cs-oleate. The Cs-oleate is precipitated from the ODE at room temperature and heated up to 100° C. before being injected into the reaction solution.

[2] Preparation of a Solution Containing a Second Precursor and a First Additive The ODE (50 mL), PbBr$_2$ (0.69 g, Sigma-Aldrich Co., Ltd., 99.999%), and ZnBr$_2$ (0.42 g, Sigma-Aldrich Co., Ltd., 99.999%) are placed in a 250 mL 3-neck flask and dried at 120° C. for one hour. Then, dry oleylamine (5 mL, STREM Chemicals, 95%, OLA) and dry OA (5 mL) are injected thereinto at 120° C. under a nitrogen atmosphere, and the obtained mixture is stirred to dissolve the PbBr$_2$ and the ZnBr$_2$ to prepare a solution containing a second precursor and a first additive.

[3] The obtained solution containing the second precursor and the first additive is heated at a temperature of 200° C., the first precursor solution obtained from [1] is rapidly injected thereto, and then Se-TOP (1.6 mmol) is added thereto. The Se-TOP is prepared as a 0.4 molar (M) solution by dissolving Se powder (RND Korea Co., LTD., 99.999%) in Tri-n-octylphosphine (STREM Chemicals, 97%, TOP). After five minutes, the reaction solution is rapidly cooled to room temperature.

Figure 7:
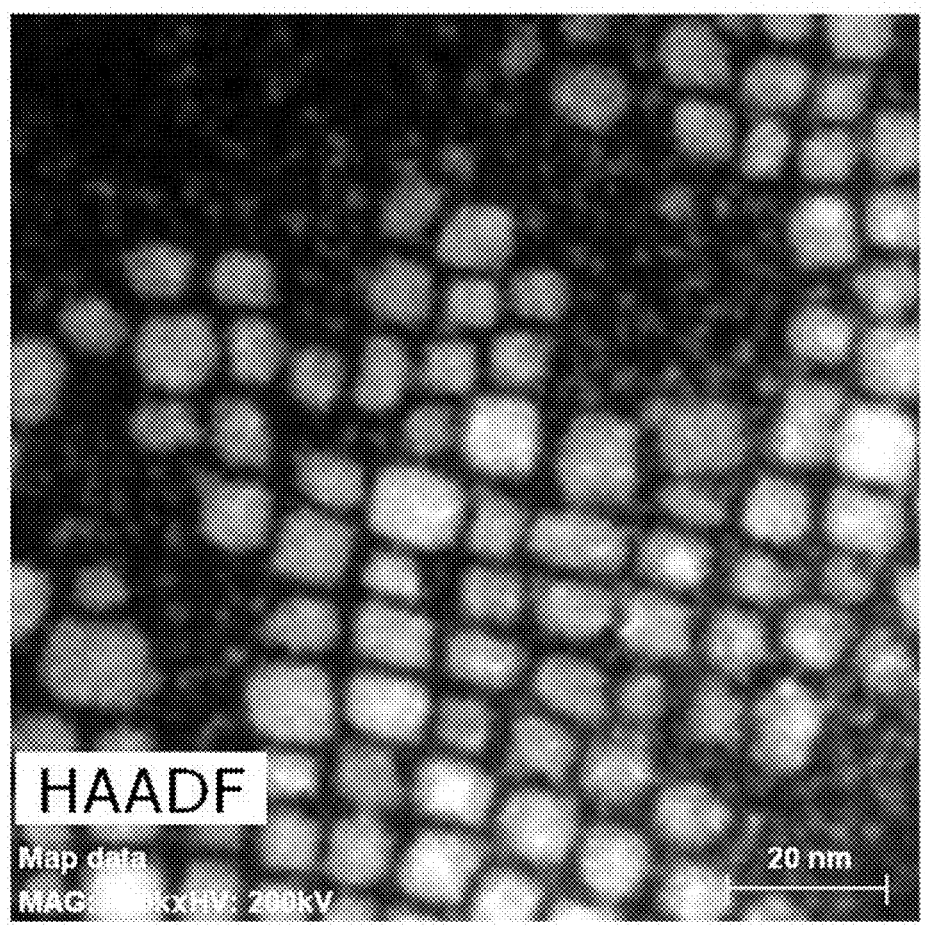
FIG. 7 is a high angle annular dark field scanning transmission electron microscopy (HAADF STEM) image showing the quantum dot prepared in Example 1.

Subsequently, as a non-solvent, isopropanol is added to the cooled reaction solution to form a precipitate, which is then washed. The precipitate is centrifuged to obtain a quantum dot, and the obtained quantum dot is dispersed in toluene and laurylmethacrylate, respectively. A Transmission Electron Microscopic (TEM) analysis is carried out for the obtained quantum dots and the results are shown in FIG. 7. The results of FIG. 7 confirm that the obtained quantum dots have a cubic or rectangular cuboid shape and their average size is about 10 nm (i.e., based on the TEM planar image, the length distribution of the long axis is 9.94 nm±1.83 nm).

Figure 4:
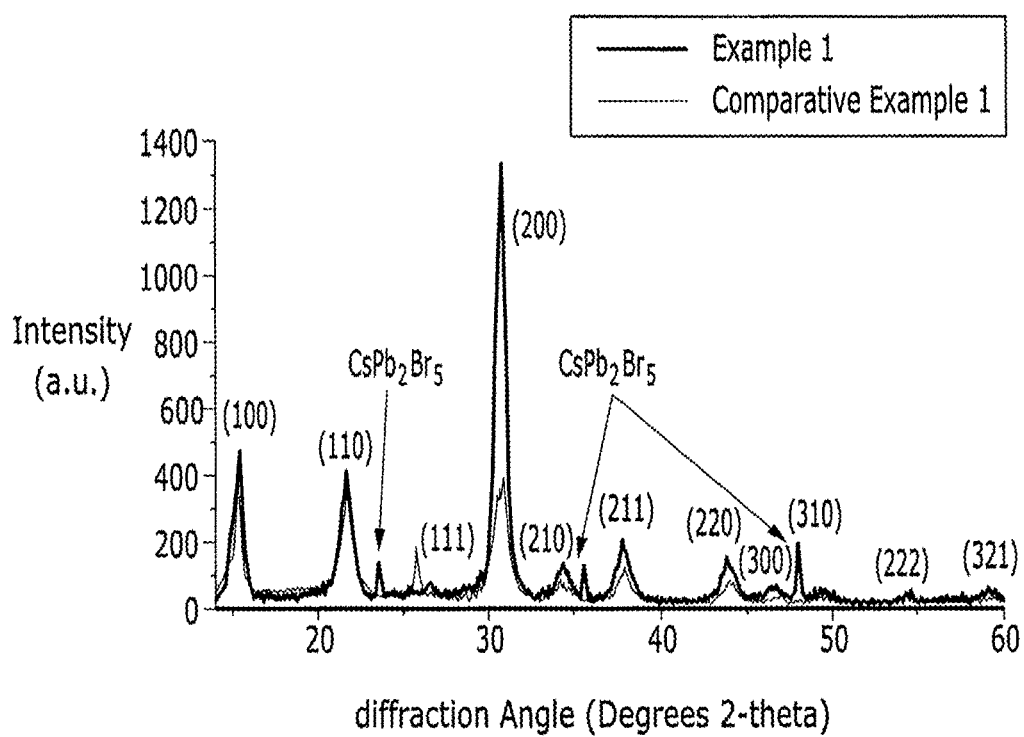
FIG. 4 is a graph of intensity (arbitrary units, a.u.) versus diffraction angle (degrees 2-theta, 2θ) showing an X-ray diffraction (XRD) spectrum of a quantum dot according to the Examples and Comparative Examples.

For the obtained quantum dots, X-ray diffraction (XRD) analyses are carried out and the results are shown in FIG. 4. The results of FIG. 4 confirm that the prepared quantum dots include a compound having a perovskite structure. The size of the quantum dot is 11.98 nm, as calculated from the XRD results and the Scherrer equation:

$$\tau = K\lambda/(\beta \cos \theta)$$

$\tau$ is the mean size of the ordered (crystalline) domains, which may be less than or equal to the grain size;

K is a dimensionless shape factor, with a value close to unity. The shape factor has a typical value of about 0.9, but varies with the actual shape of the crystallite;

$\lambda$ is the X-ray wavelength in nanometers;

$\beta$ is the line broadening at half the maximum intensity (FWHM), after subtracting the instrumental line broadening, in radians. This quantity is also sometimes denoted as $\Delta(2\theta)$, $\theta$ is the Bragg angle.

[4] The toluene dispersion and the laurylmethacrylate dispersion, each including the quantum dots, are kept in the air. A photoluminescence spectrum analysis of the quantum dots for each of the dispersions is performed both after 24 hours and after 48 hours and the results are summarized in Table 1 and Table 2.

Example 2: Synthesis of Se-Doped $CsPbBr_{3+\alpha}$

A quantum dot doped with Se and including $CsPbBr_{3+\alpha}$ is prepared in the same method as Example 1, except for not using $ZnBr_2$ as a first additive, and the toluene dispersion and the laurylmethacrylate dispersion each including the prepared quantum dots are obtained, respectively.

The obtained quantum dots have a cubic or rectangular cuboid shape and their average size is about 10 nm.

The toluene dispersion and the laurylmethacrylate dispersion, each including the quantum dots, are kept in the air. A photoluminescence spectrum analysis of the quantum dots for each of the dispersion is performed after 24 hours and after 48 hours, and the results are summarized in Table 1 and Table 2.

Example 3: Synthesis of Zn-Doped $CsPbBr_{3+\alpha}$

A quantum dot doped with Zn and including $CsPbBr_3+$, is prepared in the same method as Example 1 except for not using the Se-TOP as a second additive, and the toluene dispersion and the laurylmethacrylate dispersion each including the prepared quantum dots are obtained, respectively.

The obtained quantum dots have a cubic or rectangular cuboid shape and their average size is about 10 nm.

The toluene dispersion and the laurylmethacrylate dispersion, each including the quantum dots, are kept in the air. A photoluminescence spectrum analysis of the quantum dot for each of the dispersion is performed after 24 hours and after 48 hours, and the results are summarized in Table 1 and Table 2.

Comparative Example 1: Synthesis of Non-Doped $CsPbBr_3$

An un-doped quantum dot including $CsPbBr_3$ is prepared in the same method as Example 1 except for not using the first and second additives, and the toluene dispersion and the laurylmethacrylate dispersion each including the prepared quantum dots are obtained, respectively.

The quantum dot has a cubic or rectangular cuboid shape and an average size of about 10 nm. For the quantum dot as prepared, an X-ray diffraction analysis is carried out and the results are shown in FIG. 4. The results of FIG. 4 confirm that the prepared quantum dots include a compound having a perovskite structure. The results of FIG. 4 confirm that the FWHM at the (200) peak of the quantum dots of Example 1 is smaller than that of the quantum dots of Comparative Example 1. That is, the FWHM at the (200) peak of the quantum dots of Example 1 is 0.69 while the FWHM at the (200) peak of the quantum dots of Comparative Example 1 is 1. The size of the quantum dot calculated from the XRD data and the Scherrer equation is about 8.46 nm.

The toluene dispersion and the laurylmethacrylate dispersion, each including the quantum dots, are kept in the air. Directly after being kept in the air, after the elapse of 24 hours therefrom and after 48 hours therefrom, respectively, a photoluminescence spectrum analysis of the quantum dot for each of the dispersion is carried out and the results are summarized in Table 1 and Table 2.

TABLE 1

| Sample | After dispersion in toluene | | | Toluene dispersion after 24 h | | | Toluene dispersion after 48 h | | |
|---|---|---|---|---|---|---|---|---|---|
| | $\lambda$ (nm)[a] | FWHM (nm) | QE | $\lambda$ (nm) | FWHM (nm) | QE | $\lambda$ (nm) | FWHM (nm) | QE |
| Comparative Example 1 | 513 | 19 | 32 | 514 | 19 | 39 | — | — | — |
| Example 1 | 506 | 23 | 93 | 508 | 22 | 103 | 507 | 22 | 100 |
| Example 2 | 513 | 18 | 53 | 512 | 19 | 41 | 512 | 19 | 43 |
| Example 3 | 508 | 23 | 78 | 507 | 23 | 85 | 507 | 23 | 93 |

[a]$\lambda$ (nm): wavelength in nanometers.

TABLE 2

| Sample | After dispersed in LMA | | | LMA dispersion after 24 h | | | LMA dispersion after 48 h | | |
|---|---|---|---|---|---|---|---|---|---|
| | $\lambda$ (nm)[a] | FWHM (nm) | QE | $\lambda$ (nm) | FWHM (nm) | QE | $\lambda$ (nm) | FWHM (nm) | QE |
| Comparative Example 1 | 506 | 21 | 28 | 511 | 23 | 31 | — | — | — |
| Example 1 | 503 | 22 | 67 | 503 | 21 | 68 | 508 | 22 | 70 |
| Example 2 | 512 | 21 | 50 | 514 | 20 | 42 | 512 | 21 | 48 |
| Example 3 | 503 | 22 | 69 | 501 | 23 | 65 | 503 | 22 | 70 |

[a]$\lambda$ (nm): wavelength in nanometers.

The results of Tables 1 and 2 confirm that a quantum dot doped with a first dopant and/or a second dopant may maintain a desirable FWHM when dispersed in either toluene or laurylmethacrylate, and show a suitable improvement in quantum efficiency.

Example 4: Element Analysis of the Quantum Dot

[1] TEM-EDX Analysis

For the quantum dots prepared in Example 1 and Comparative Example 1, a TEM-EDX-analysis is carried out. As a result, in the case of the quantum dot of Example 1, an atomic ratio of the Br with respect to the Cs is 3.14, while in the case of the quantum dot of Comparative Example 1, an atomic ratio of the Br with respect to the Cs is 2.83.

The aforementioned results confirm that the quantum dots of Example 1 include a stoichiometric excess amount of halogen.

[2] XPS Analysis

For the quantum dots prepared in Example 1 and Comparative Example 1, an XPS analysis is carried out.

The results confirm that in case of the quantum dots of Comparative Example 1, an atomic ratio of the Br with respect to the Pb (Pb4f/Br3d) is 59.4%/26.0%, while in case of the quantum dots of Example 1, the atomic ratio of the Br with respect to Pb (Pb4f/Br3d) is 66.0%/22.6%. The results also confirm that the quantum dots of Example 1 include a stoichiometric excess amount of the Br.

[3] ICP-AES Analysis

For the quantum dots of Example 1, an ICP-AES analysis is carried out, and the results are shown below:

TABLE 3

| Sample | Mole ratio | | | ppm | | |
|---|---|---|---|---|---|---|
| | Zn | Pb | Se | Zn | Pb | Se |
| Example 1 | 0.115 | 0.8 | 0.085 | 0.04 | 0.95 | 0.04 |

The results confirm that the quantum dots of Example 1 include a Zn and/or Se dopant.

Example 5: Preparation of Composition for Light Conversion Layer and Light Conversion Layer 30 wt % of lauryl methacrylate, 36 wt % of tricyclodecane dimethanol diacrylate, 4 wt % of trimethylol propane triacrylate, 20 wt % of epoxy diacrylate oligomer (Manufacturer: Sartomer), 1 wt % of 1-hydroxy-cyclohexyl-phenyl-ketone, and 1 wt % of 2,4,6-trimethylbenzoyl-diphenyl-phosphine oxide are mixed to prepare a monomer and an oligomer mixture. The mixture is defoamed under vacuum.

The nanoparticles synthesized in Example 1 are centrifuged one time. A toluene dispersion of the semiconductor nanocrystals [concentration: (absorption at 449 nm)×(volume of QD solution (mL))=3.75] thus obtained is mixed again with an excess amount of ethanol, and the semiconductor nanocrystal particles are centrifuged. The separated semiconductor nanocrystals are dispersed in 0.15 g (10 wt % of the entire composition except for an initiator) of lauryl methacrylate, the monomer (oligomer) mixture (1.35 g) is added thereto, and the resulting mixture is stirred to prepare a semiconductor nanocrystal composition.

About 1 g of the semiconductor nanocrystal composition prepared above is drop-cast on a surface of a PET film sputtered with SiOx (purchased from I-component, Hereinafter, a barrier film). On the composition, another barrier film is placed, and then a UV-curing is carried out for 10 seconds (photo intensity: 100 milliwatts per square centimeter (mW/cm$^2$)) to provide a light conversion layer. The light conversion layer is inserted between a light guide panel and an optical sheet of a 60-inch TV mounted with a blue LED having a peak wavelength of 449 nm, and the TV is operated and the luminance of the layer is measured at a distance of about 45 cm with spectroradiometer (Konica Minolta Inc., CS-2000). The results are compiled in Table 4.

Example 6

A quantum dot-polymer composite is prepared in the same manner as Example 5 except for using the quantum dot-LMA dispersion prepared in Example 2.

For the quantum dot-polymer composite, a PL spectroscopy analysis is made, and the results are compiled in Table 4.

Example 7

A quantum dot-polymer composite is prepared in the same method as Example 5 except for using the quantum dot-LMA dispersion of Example 3.

For the quantum dot-polymer composite, a PL spectroscopy analysis is made, and the results are compiled in Table 4.

Comparative Example 2

A quantum dot-polymer composite is prepared in the same method as Example 5 except for using the quantum dot-LMA dispersion of Comparative Example 1.

For the quantum dot-polymer composites of Examples 5-7 and Comparative Example 2, a PL spectroscopy analysis is made, and the results are compiled in Table 4. The quantum dot-polymer composites are further measured to determine the optical conversion efficiency, and the results are provided in Table 4:

TABLE 4

| | Quantum dot-polymer composite (QD sheet) | | |
|---|---|---|---|
| Samples | λ (nm)$^a$ | FWHM (nm) | Light conversion efficiency (%) |
| Comparative Example 2 | 522 | 18 | 14.7 |
| Example 5 | 507 | 19 | 61.4 |
| Example 6 | 505 | 18 | 49.3 |
| Example 7 | 506 | 19 | 65.7 |

$^a$λ (nm): wavelength in nanometers.

Referring to Table 4, the quantum dot-polymer composite sheet prepared in the Examples may show significantly improved light conversion efficiency in comparison with the QD sheet of the Comparative Example. While this disclosure has been described in connection with what is presently considered to be practical example embodiments, it is to be understood that the invention is not limited to the disclosed embodiments, but, on the contrary, is intended to cover various modifications and equivalent arrangements included within the spirit and scope of the appended claims.

What is claimed is:

1. A quantum dot having a perovskite crystal structure and comprising a compound represented by Chemical Formula 1:

Chemical Formula 1

$ABX_{3+\alpha}$, wherein, A is a Group IA metal selected from Rb, Cs, Fr, and a combination thereof, B is a Group IVA metal selected from Si, Ge, Sn, Pb, and a combination thereof, X is a halogen selected from F, Cl, Br, and I, $BF_4$, or a combination thereof, and α is greater than 0 and less than or equal to about 3; and wherein the quantum dot has a size of about 1 nanometer to about 50 nanometers, wherein the quantum dot further comprises at least one of a first dopant and a second dopant, wherein the first dopant comprises potassium or a first metal having a crystal ionic radius of less than about 133 picometers, wherein the first metal is different from the Group IA metal and the Group IVA metal, and wherein the second dopant comprises a non-metal element that forms a bond with the Group IVA metal.

2. The quantum dot of claim 1, wherein a photoluminescence peak wavelength of the quantum dot is in a range of about 300 nanometers to about 700 nanometers.

3. The quantum dot of claim 1, wherein a photoluminescence peak wavelength of the quantum dot is in a range of about 400 nanometers to about 680 nanometers.

4. The quantum dot of claim 1, wherein the first metal has a smaller crystal ionic radius than a crystal ionic radius of the Group IVA metal of the B in Chemical Formula 1.

5. The quantum dot of claim 1, wherein the first metal is selected from Zn, Cd, Hg, Ga, In, Cu, Al, Li, Na, Be, Mg, Ca, Sr, Ag, Pt, Pd, Ni, Co, Fe, Cr, Zr, Mn, Ti, Ce, Gd, and a combination thereof, and the non-metal element is selected from S, Se, Te, and a combination thereof.

6. The quantum dot of claim 1, wherein the quantum dot comprises the first dopant, and an amount of the first dopant is greater than or equal to about 0.001 parts per million when measured by an inductively coupled plasma-atomic emission spectroscopy analysis.

7. The quantum dot of claim 1, wherein the quantum dot comprises the second dopant, and an amount of the second dopant is greater than or equal to about 0.001 parts per million when measured by an inductively coupled plasma-atomic emission spectroscopy analysis.

8. The quantum dot of claim 1, wherein the quantum dot comprises the first dopant and the second dopant, and each of an amount of the first dopant and an amount of the second dopant is greater than or equal to about 0.001 parts per million when measured by an inductively coupled plasma-atomic emission spectroscopy analysis, respectively.

9. The quantum dot of claim 1, wherein the compound is selected from $CsPbCl_{3+\alpha}$, $CsPbBr_{3+\alpha}$, $CsPbI_{3+\alpha}$, $CsPb(Cl,I)_{3+\alpha}$, $CsPb(Br,I)_{3+\alpha}$, $CsPb(Br,Cl)_{3+\alpha}$, and a combination thereof.

10. The quantum dot of claim 1, wherein an atomic ratio of a halogen relative to the Group IA metal when measured by a transmission electron microscope-energy dispersive X-ray spectroscopy analysis is greater than 3.0.

11. The quantum dot of claim 1, wherein an atomic ratio of a halogen relative to the Group IA metal when measured by a transmission electron microscope-energy dispersive X-ray spectroscopy analysis is greater than 3.1.

12. The quantum dot of claim 1, wherein the quantum dot comprises an organic ligand compound selected from $RCOOH$, $RNH_2$, $R_2NH$, $R_3N$, $RSH$, $R_3PO$, $R_3P$, $ROH$, $RCOOR'$, $RPO(OH)_2$, $R_2POOH$, $RCOOCOR'$ wherein, each R and R' are independently a substituted or unsubstituted C1 to C24 aliphatic hydrocarbon group or a substituted or unsubstituted C6 to C24 aromatic hydrocarbon group, and a combination thereof, on a surface of the quantum dot.

13. The quantum dot of claim 1, wherein the quantum dot has a full width at half maximum photoluminescence peak wavelength of less than or equal to about 30 nanometers.

14. The quantum dot of claim 1, wherein the quantum dot has a quantum efficiency of greater than or equal to about 60%.

15. A method of producing a quantum dot, the method comprising:

providing a reaction solution comprising a first precursor comprising a Group IA metal selected from Rb, Cs, and Fr, $NR_4^+$, $[CH(NH_2)_2]^+$, or a combination thereof, and optionally $BF_4$, wherein, each R is independently a hydrogen atom or a substituted or unsubstituted C1 to C10 straight or branched alkyl group; and a second precursor comprising a halogen and a Group IVA metal selected from Ge, Si, Sn, Pb, and a combination thereof; and, at least one of a first additive and a second additive, wherein the first additive comprises a halogen and potassium or a first metal having a crystal ionic radius of less than or equal to 133 picometers and being different from the Group IA metal and the Group IVA metal, and the second additive comprises a non-metal element that forms a bond with the Group IVA metal; and reacting the first precursor and the second precursor in the reaction solution to synthesize a quantum dot that has a perovskite crystal structure, comprises a compound represented by Chemical Formula 1, and has a size of about 1 nanometer to about 50 nanometers:

$ABX_{3+\alpha}$  Chemical Formula 1 wherein A is the Group IA metal, $NR_4^+$, $[CH(NH_2)_2]^+$, or a combination thereof, B is the Group IVA metal, X is $BF_4$, the halogen, or a combination thereof, and α is greater than 0 and less than or equal to about 3.

16. The method of claim 15, wherein the first metal is present and is selected from Zn, Cd, Hg, Ga, In, Cu, Al, Li, Na, Be, Mg, Ca, Sr, Ag, Pt, Pd, Ni, Co, Fe, Cr, Zr, Mn, Ti, Ce, Gd, and a combination thereof, and the non-metal element is selected from S, Se, Te, and a combination thereof.

17. The method of claim 15, wherein the first precursor is selected from a metal powder, a metal carbonate, an alkylated metal compound, a metal alkoxide, a metal carboxylate, a metal nitrate, a metal perchlorate, a metal sulfate, a metal acetylacetonate, a metal halide, a metal cyanide, a metal hydroxide, a metal oxide, a metal peroxide, $NR_4BF_4$, and a combination thereof.

18. The method of claim 15, wherein the second precursor is selected from a Pb halide, a Ge halide, a Si halide, a Sn halide, and a combination thereof.

19. The method of claim 15, wherein the reaction solution comprises the first additive and the first additive comprises a halide of the first metal.

20. The method of claim 15, wherein the first additive is selected from $ZnX_2$, $CdX_2$, $HgX_2$, $GaX_3$, $InX_3$, $TlX_3$, $CuX_2$, $AlX_3$, $LiX$, $NaX$, $BeX_2$, $MgX_2$, $CaX_2$, $SrX_2$, $AgX$, $PtX_2$, $PtX_4$, $PdX_2$, $NiX_2$, $CoX_2$, $FeX_2$, $CrX_2$, $CrX_3$, $ZrX_3$, $ZrX_4$, $MnX_2$, $TiX_2$, $CeX_2$, $GdX_2$, and a combination thereof, wherein X is F, Cl, Br, or I.

21. The method of claim 15, wherein the reaction solution comprises the second additive, and the second additive is selected from sulfur-trioctylphosphine, sulfur-tributylphosphine, sulfur-triphenylphosphine, sulfur-trioctylamine, sulfur-octadecene, sulfur-diphenylphosphine, sulfur-oleylamine, sulfur-dodecylamine, dodecanethiol, octanethiol, selenium-trioctylphosphine (Se-TOP), selenium-tributylphosphine (Se-TBP), selenium-triphenylphosphine, selenium-octadecene (Se-ODE), selenium-diphenylphosphine, selenium-dodecylamine, tellurium-tributylphosphine, tellurium-triphenylphosphine, tellurium-trioctylphosphine, tellurium-octadecene (Te-ODE), tellurium-diphenylphosphine, tellurium-oleylamine, tellurium-dodecylamine, and a combination thereof.

22. The method of claim 15, wherein the providing the reaction solution comprises adding a solvent selected from a C6 to C22 amine compound, a nitrogen-containing heterocyclic compound, a C6 to C40 aliphatic hydrocarbon, a C6 to C30 aromatic hydrocarbon, a C6 to C22 phosphine oxide compound, a C12 to C22 aromatic ether, and a combination thereof.

23. The method of claim 15, wherein the reaction solution further comprises at least one organic ligand compound selected from RCOOH, RNH$_2$, R$_2$NH, R$_3$N, RSH, R$_3$PO, R$_3$P, ROH, RCOOR', RPO(OH)$_2$, R$_2$POOH, RCOOCOR' wherein, each R and R' are independently a substituted or unsubstituted C1 to C24 aliphatic hydrocarbon group or a substituted or unsubstituted C5 to C24 aromatic hydrocarbon group, and a combination thereof.

24. The method of claim 15, wherein the providing the reaction solution comprises preparing a first solution comprising the first precursor;

preparing a second solution comprising the second precursor and optionally the first additive; and combining the second solution with the first solution and optionally the second additive;

wherein at least one of the first additive and the second additive is used.

25. A quantum dot-polymer composite comprising
a polymer matrix; and
a quantum dot of claim 1,
wherein the quantum dot is dispersed in the polymer matrix.

26. The quantum dot-polymer composite of claim 25, wherein the polymer matrix is selected from a thiolene polymer, a (meth)acrylate polymer, an urethane polymer, an epoxy polymer, a vinyl polymer, a silicone polymer resin, and a combination thereof.

27. The quantum dot-polymer composite of claim 25, wherein the quantum dot-polymer composite has blue light conversion efficiency of greater than or equal to about 15%.

28. An electronic device comprising the quantum dot-polymer composite of claim 25.

29. An electronic device comprising the quantum dot of claim 1.

* * * * *